United States Patent
Ohannaidh et al.

(10) Patent No.: US 8,369,817 B2
(45) Date of Patent: Feb. 5, 2013

(54) ANALOG FIR FILTER

(75) Inventors: Eoin Ohannaidh, Laval (FR); Stéphane Le Tual, Saint Egrève (FR); Loïc Joet, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 529 days.

(21) Appl. No.: 12/690,793

(22) Filed: Jan. 20, 2010

(65) Prior Publication Data

US 2010/0171548 A1    Jul. 8, 2010

Related U.S. Application Data

(63) Continuation-in-part of application No. 12/539,896, filed on Aug. 12, 2009, now abandoned.

(30) Foreign Application Priority Data

Aug. 22, 2008  (FR) .................................... 08 55683

(51) Int. Cl.
*H04B 1/10*    (2006.01)
(52) U.S. Cl. ........... 455/307; 455/87; 455/306; 327/552

(58) Field of Classification Search .................. None
See application file for complete search history.

(56) References Cited

U.S. PATENT DOCUMENTS 4,475,170 A    10/1984  Haque
2008/0007326 A1    1/2008  Iida

OTHER PUBLICATIONS

French Search Report dated Jan. 23, 2009, from corresponding Application No. 08/55683.

*Primary Examiner* — Minh D Dao
(74) *Attorney, Agent, or Firm* — Wolf, Greenfield & Sacks, P.C.

(57) ABSTRACT

An analog finite impulse response (AFIR) filter including at least one variable transconductance block having an input for receiving an input voltage and being adapted to sequentially apply each of a plurality of transconductance levels to the input voltage during at least one of a plurality of successive time periods to generate an output current at an output of the variable transconductance block, the at least one variable transconductance block including a plurality of fixed transconductance blocks each receiving the input voltage and capable of being independently activated to supply the output current; and a capacitor coupled to the output of the variable transconductance block to receive the output current and provide an output voltage of the filter.

18 Claims, 5 Drawing Sheets

ANALOG FIR FILTER

CROSS REFERENCE TO RELATED APPLICATIONS

This application is a continuation-in-part of U.S. application Ser. No. 12/539,896, filed Aug. 12, 2009 entitled ANALOG FIR FILTER, which application claims the priority benefit of French patent application Ser. No. 08/55683, filed on Aug. 22, 2008, entitled ANALOG FIR FILTER, which applications are hereby incorporated by reference to the maximum extent allowable by law.

BACKGROUND OF THE INVENTION

1. Field of the Invention

The present invention relates to an analog finite impulse response filter and to a method of filtering an input signal using an analog finite impulse response filter.

2. Discussion of the Related Art

Figure 1:
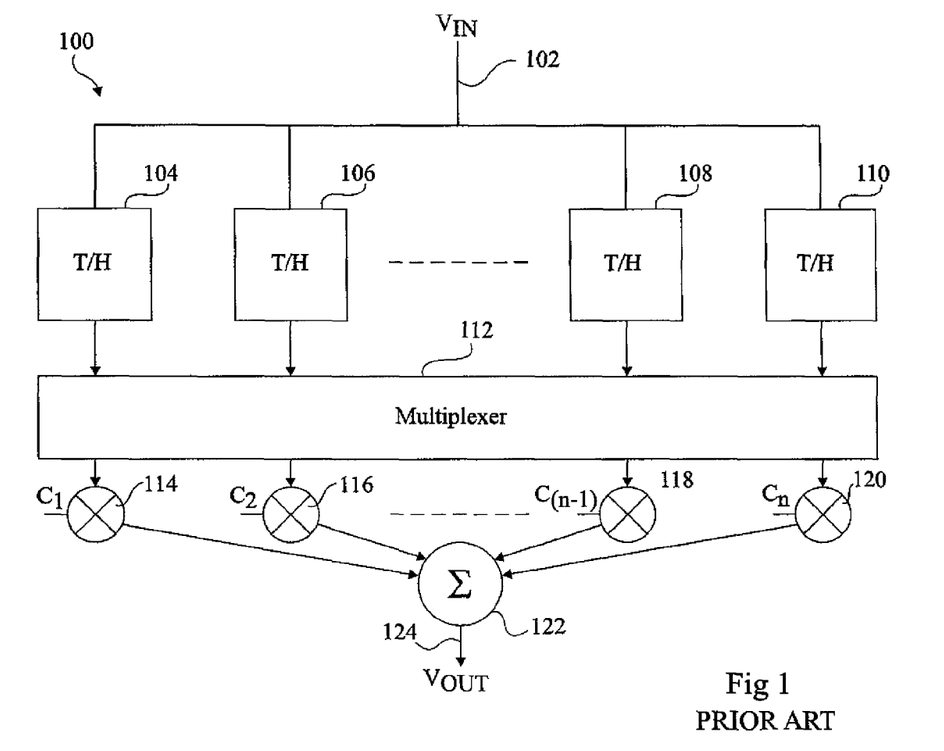
FIG. 1 (described above) illustrates an analog finite impulse response filter.

FIG. 1 illustrates an analog finite impulse response filter (analog FIR) 100. Such a filter is for example described in IEEE publication titled "A low-power 170-MHz discrete-time analog FIR filter", Wang et al., Journal of Solid-State Circuits, vol. 33, No 3, March 1998.

Analog FIR 100 comprises an input node 102 for receiving an input voltage $V_{IN}$, and a series of track-and-hold blocks 104, 106, 108 and 110, which sample the input signal at regular intervals offset with respect to each other. The outputs of blocks 104 to 110 are provided to a multiplexer 112, which connects these outputs to multipliers 114, 116, 118 and 120. Multipliers 114 to 120 multiply the signals from multiplexer 112 by respective coefficients $C_1$ to $C_n$. The outputs of multipliers 114 to 120 are provided to an adder 122, which sums these outputs to provide an output voltage $V_{OUT}$ on line 124.

Such a filter has a number of drawbacks in terms of performance. In particular, it does not provide a clean cut-off, as high frequency components of the input signal can be allowed to pass through the filter, leading to undesirable noise.

SUMMARY OF THE INVENTION

Embodiments of the present invention aim to at least partially address one or more of problems in the prior art.

According to an aspect of the present invention, there is provided an analog finite impulse response filter comprising at least one variable transconductance block comprising an input for receiving an input voltage and being adapted to sequentially apply each of a plurality of transconductance levels to the input voltage during at least one of a plurality of successive time periods to generate an output current at an output of the variable transconductance block, the at least one variable transconductance block comprising a plurality of fixed transconductance blocks each receiving said input voltage and capable of being independently activated to supply said output current; and a capacitor coupled to the output of the variable transconductance block to receive the output current and provide an output voltage of the filter.

According to one embodiment of the present invention, each fixed transconductance block comprises a control input for receiving an activation signal.

According to another embodiment of the present invention, the output of said at least one variable transconductance blocks is connected to an analog to digital converter.

According to another embodiment of the present invention, the AFIR filter comprises a plurality of the variable transconductance blocks adapted to operate out of phase with each other, and a plurality of the capacitors each coupled to the output of a respective one of the variable transconductance blocks to receive the corresponding output current.

According to another embodiment of the present invention, the AFIR filter comprises a plurality of analog to digital converters coupled to said plurality of capacitors, and a digital multiplexer arranged to sequentially couple the outputs of said analog to digital converters to an output node to provide the output voltage of said filter.

According to another embodiment of the present invention, each of said plurality of fixed transconductance blocks comprises at least one switch adapted to select or deselect the fixed level transconductance block to provide said output current, the AFIR filter comprising a control block adapted to control said at least one switch.

According to another embodiment of the present invention, each of said plurality of fixed transconductance blocks has the same transconductance level, and wherein said control block is arranged to select a different number of said fixed level transconductance blocks to provide each of said plurality of transconductance levels.

According to another embodiment of the present invention, the plurality of fixed transconductance blocks each comprises at least one transistor having a control terminal coupled to receive the input voltage, and main current terminals coupled to provide the output current to the capacitor when selected by the switch.

According to another embodiment of the present invention, each of the plurality of fixed transconductance blocks has a fixed transconductance level equal to a respective one of the plurality of transconductance levels.

According to another embodiment of the present invention, the analog FIR filter further comprises a switch coupled in parallel with the capacitor, the switch arranged to periodically reset the capacitor.

According to a further aspect of the present invention, there is provided an electronic device comprising an input node for receiving an input voltage; and the above AFIR filter coupled to receive the input signal.

According to a further aspect of the present invention, there is provided a hard disk drive comprising an input node for receiving an input voltage; and the above AFIR filter coupled to receive the input signal.

According to a further aspect of the present invention, there is provided a mobile telephone comprising an input node for receiving an input voltage; and the above AFIR filter coupled to receive the input signal.

According to yet a further aspect of the present invention, there is provided a radio receiver comprising an input node for receiving an input voltage; and the above AFIR filter coupled to receive the input signal.

According to an embodiment of the present invention, the above electronic device, hard disk drive, mobile telephone, or radio receiver further comprises an analog to digital converter coupled to receive the output voltage of the filter; and a digital signal processor coupled to the output of the analog to digital converter.

According to yet a further aspect of the present invention, there is provided a method of filtering an input signal comprising sequentially applying, by at least one variable transconductance block, each of a sequence of transconductance levels to the input signal during one or more of a plurality of successive time periods to generate an output current, the at least one variable transconductance block comprising a plurality of fixed transconductance blocks each receiving said input voltage and capable of being independently activated to supply said output current; and receiving by a capacitor the output current to generate an output voltage of the filter.

According to an embodiment of the present invention, the step of applying the sequence of transconductance levels is repeated at first regular time intervals, the method further comprising performing the step of applying the sequence of transconductance levels at second regular time intervals offset with respect to the first regular time intervals.

According to an embodiment of the present invention, applying the sequence of transconductance levels comprises, for each transconductance levels, selecting a number of said plurality of fixed value transconductance blocks.

According to another embodiment of the present invention, the method further comprises periodically resetting the voltage on the capacitor.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

With reference again to FIG. 1, the output of AFIR filter 100 at time nT can be considered as a weighted sum of a number of previously sampled inputs:

$$V_{OUT}(nT) = \sum_{i=1}^{N} C_i V_{IN}([n-i]T)$$

where N is the number of multipliers, $C_i$ is the ith coefficient, where i is equal to integers between 1 and N, and $V_{IN}([n-i]T)$ is the sampled input voltage at time (n−i)T, in other words i periods T before nT.

Figure 2A:
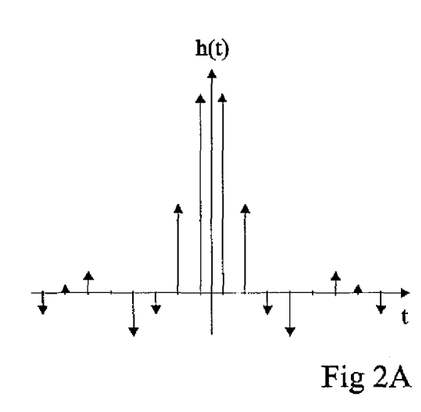
FIGS. 2A and 2B illustrate an impulse response and a frequency response respectively of the filter of FIG. 1 according to one example.

The filter 100 of FIG. 1 performs the filtering operation based on an impulse response h(t) comprising a number of weighted Dirac functions, as shown by the example of FIG. 2A. Each arrow in FIG. 2A represents a Dirac function of a different weight, and is implemented by a multiplication of a sampled and delayed version of the input by one of the coefficients $C_1$ to $C_N$ of FIG. 1.

Figure 2B:
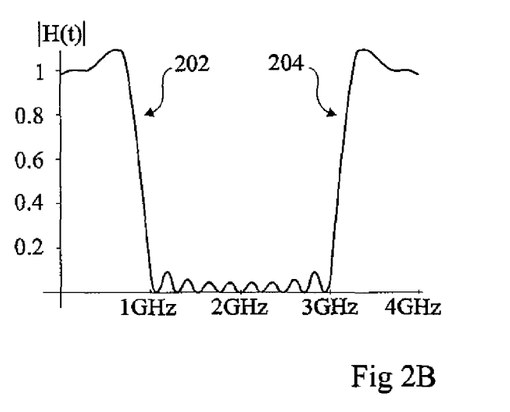

FIG. 2B illustrates an example of a frequency response H(f) of such a filter when the weighted train of Dirac functions of FIG. 2A is used, based on a sampling frequency of 4 GHz. A cut-off frequency of the filter is approximately 1 GHz, as shown by the portion 202 in the graph. However, this type of filter also results in a repetition of the target frequency response inverted every 111 Hz, as illustrated by the second pass band labelled 204, starting at 3 GHz. This second band pass of the filter is undesirable as it can lead to unwanted noise and worse still, allow undesirable interference signals to pass through the filter. Likewise, further higher frequency repetitions of the pass band can also lead to noise and undesirable interference signals passing through the filter.

Figure 3:
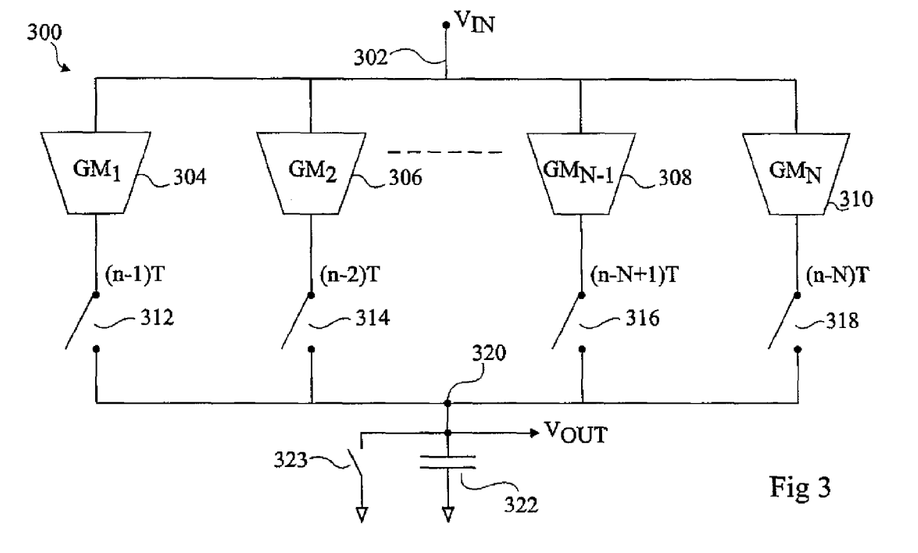
FIG. 3 illustrates an analog FIR filter according to an embodiment of the present invention.

FIG. 3 illustrates an analog FIR filter 300. As illustrated, filter 300 comprises input line 302 for receiving input voltage $V_{IN}$. Line 302 is coupled to the inputs of a number of transconductance (GM) blocks 304, 306, 308 and 310. One or more additional transconductances blocks may be provided between transconductance blocks 306 and 308. The output of each of the transconductance blocks 304 to 310 is coupled to an input node of a respective switch 312, 314, 316 and 318, the output node of these switches being in turn coupled to an output node 320 of the filter, providing an output voltage $V_{OUT}$. Output node 320 is coupled to a ground voltage, for example at 0 V, via a capacitor 322, which accumulates current provided by each of the transconductance blocks 304 to 310 to generate the output voltage $V_{OUT}$. The output node 320 is also coupled to ground via a switch 323, allowing the capacitor to be discharged at the end of each cycle.

Each of the transconductance blocks 304 to 310 applies a different transconductance level to the input voltage $V_{IN}$, to provide a different weighted output. In particular, each of these transconductance blocks applies a respective transconductance coefficient $GM_1$ to $GM_N$ to the input signal $V_{IN}$. The transconductance coefficient is defined as being the change of current at the output of the transconductance block over the change of voltage at the input. The change in the output current $\Delta I_{OUTi}$ of each of the transconductance blocks is thus equal to:

$$\Delta I_{OUTi} = \Delta V_{IN} GM_i$$

where $I_{OUTi}$ is the output of the ith transconductance block, and $GM_i$ is the transconductance coefficient of the ith transconductance block. For example, assuming transconductance block 304 has a transconductance of 300 mA/V, a change in voltage of 1 V at the input node will cause a change in current at the output of a transconductance block of 300 mA.

In operation, switches 312 to 318 are controlled in sequence to couple the outputs of transconductance blocks 304 to 310 to capacitor 322. Each transconductance block 304 to 310 is coupled to the capacitor 322 for a period of time T, delayed by one period T with respect to the previous block, the first block being coupled to capacitor 322 for a period T starting at time (n−1)T, the second for a period T starting at time (n−2)T, etc., and the final Nth block being coupled for a period T starting at time (n−N)T.

Switches 312 to 318 are controlled to couple each of the transconductance blocks 304 to 310 in turn to capacitor 322, and thus capacitor 322 is charged by the current from each of the transconductance blocks in turn, based on the input voltage $V_{IN}$ and on the transconductance coefficient. $V_{OUT}$ at time nT is equal to:

$$V_{OUT}(nT) = \frac{-1}{C_{int}} \sum_{i=-N/2}^{N/2} GM_i([n-i]T) * [u(nT+T/2) - u(nT-T/2)]$$

where N is the number of transconductance blocks, $C_{int}$ is the capacitance of the output capacitor 322, $GM_i$ is the transconductance coefficient of the ith block, i being an integer between -N/2 and N/2, and u(nT+T/2)-u(nT-T/2) is a pass function having duration T and being equal to 1 between nT-T/2 and nT+T/2 and equal to 0 elsewhere. The voltage at node 320 is for example sampled at the end of each cycle prior to resetting the capacitor by activating switch 323.

Figure 4:
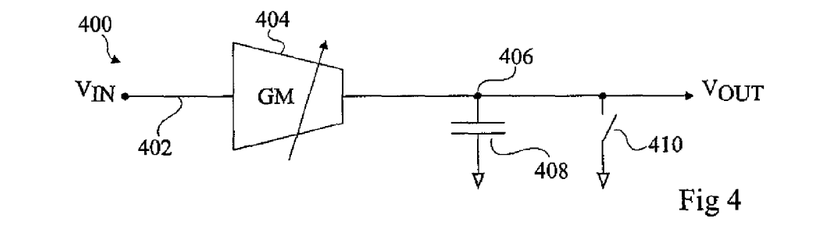
FIG. 4 illustrates an analog FIR filter according to a further embodiment of the present invention.

FIG. 4 illustrates an analog FIR filter 400 according to a different embodiment, in which an input line 402 for receiving an input voltage $V_{IN}$ is coupled to a variable transconductance block 404, which is controlled to apply a stepped transconductance level to the input voltage and generate an output current. The output of block 404 is coupled to an output node 406, which is coupled to one terminal of a capacitor 408 having its other terminal coupled to a ground voltage, for example at 0 V, and provides an output voltage $V_{OUT}$ of the filter. The output node 406 is also coupled to the ground voltage via a switch 410 allowing the capacitor 408 to be discharged at the end of each cycle.

In operation, in a similar fashion to the circuit 300 of FIG. 3, a number of different transconductance levels are applied by the variable transconductance block 404 to the input voltage $V_{IN}$ to generate an output current. Again, the output current is accumulated by the capacitor 408, which provides the output voltage $V_{OUT}$. However, in this embodiment, a single variable transconductance block provides the various transconductance levels.

Figure 5:
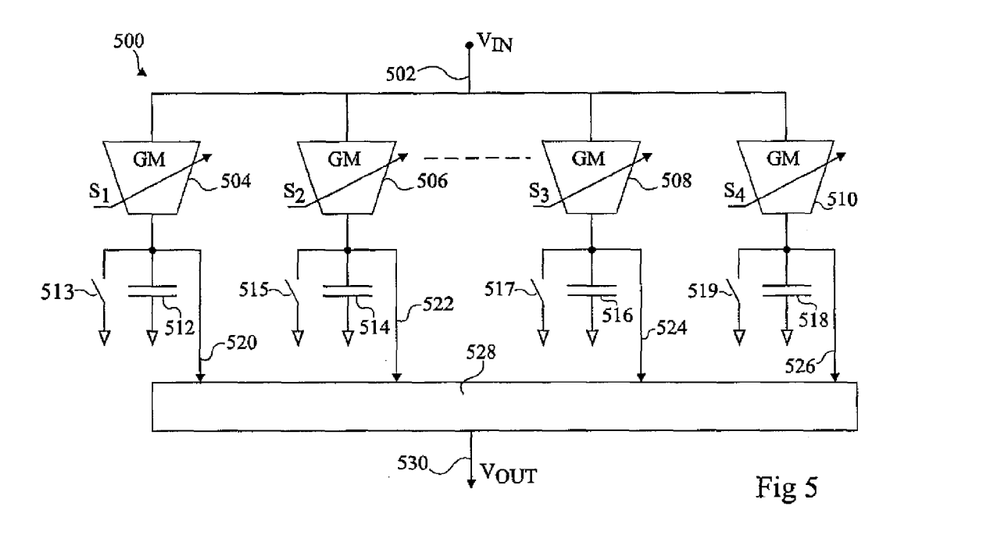
FIG. 5 illustrates an analog FIR filter according to yet a further embodiment of the present invention.

FIG. 5 illustrates an analog FIR filter 500 according to an alternative embodiment. Filter 500 comprises an input node 502 for receiving an input voltage $V_{IN}$, and a series of variable transconductance blocks 504, 506, 508 and 510 coupled to the input node 502. As indicated by the dashed lines in FIG. 5, more variable transconductance blocks may be provided between blocks 506 and 508. The blocks 504 to 510 are coupled by their outputs to respective capacitors 512, 514, 516 and 518, and respective switches 513, 515, 517 and 519. The capacitors and switches 512 to 519 are in turn coupled to a ground voltage, which may be at 0 V. The output of each of the blocks 504 to 510 is also coupled to a multiplexer block 528, which selects one of these outputs in turn to provide the output voltage $V_{OUT}$ on a line 530.

Whereas the filter 400 of FIG. 4 provides only one output voltage $V_{OUT}$ every NT seconds, where N is the number of different transconductance levels applied in one cycle, if an output is required more often that this, multiple variable transconductance blocks 504 to 510 of FIG. 5 allow an output to be provided more often, the frequency depending on the number of variable transconductance blocks. In particular, each output 520, 522, 524 and 526 is selected in turn by the multiplexer block 528, and after the corresponding voltage has been sampled in this way, the switches 513, 515, 517 and 519 allow the corresponding capacitor to be reset to 0 V.

Figure 6A:
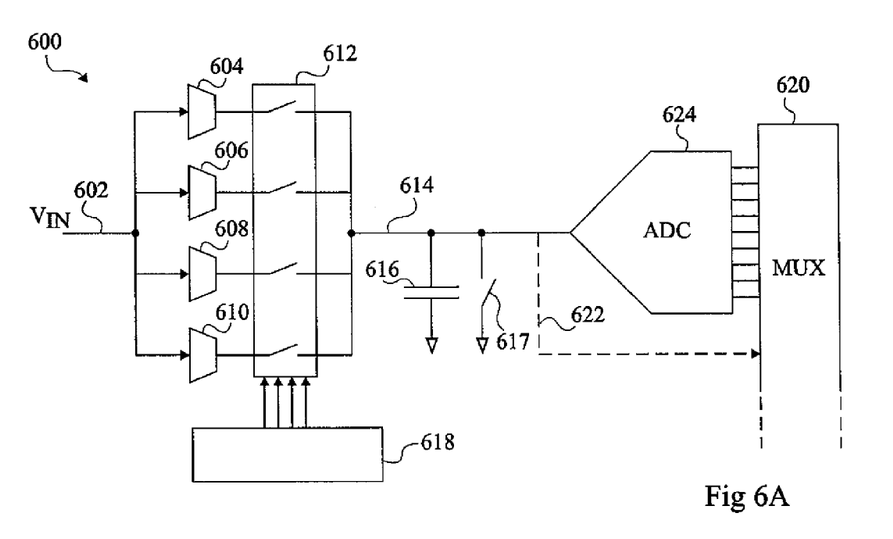
FIG. 6A illustrates a variable transconductance block according to an embodiment of the present invention.

FIG. 6A illustrates a variable transconductance block 600, which is for example the variable transconductance block 404 of FIG. 4, or one of the variable transconductance blocks 504 to 510 of FIG. 5, in more detail.

Block 600 comprises an input node 602 for receiving the input voltage $V_{IN}$, and a series of unitary transconductance blocks 604, 606, 608 and 610 coupled to $V_{IN}$. Each of the blocks 604 to 610 provides a fixed transconductance level $GM_f$. The outputs of fixed transconductance blocks 604 to 610 are coupled to a switch block 612, which allows 1, 2, 3 or 4 of the outputs from the blocks 604 to 610 to be coupled to an output line 614 of the switch block, to provide an output of the variable transconductance block. Output 614 is coupled to one terminal of a capacitor 616, and to one terminal of a switch 617, the other terminal of each being coupled to a ground voltage, for example at 0 V. Switch block 612 is controlled by a control block 618, which provides four control signals, one to each of the switches of the switch block, one switch of the switch block being associated with each output of the blocks 604 to 610.

The output of the variable transconductance block 600 is for example coupled to a multiplexer 620, which is, for example, the multiplexer 528 of the FIG. 5, either directly as shown by dash line 622, or via an analog to digital converter (ADC) 624, which provides a digital output representing the voltage at node 614 on a number of parallel lines.

In operation, the number of blocks coupled by switches of the switch block 612 to the output node 614 determines the level of transconductance provided by the variable transconductance block. In this embodiment, as four fixed transconductance blocks 604 to 610 are provided, five different levels can be achieved. These levels are 0, when no transconductance block is coupled to capacitor 616, $1 \times GM_f$ when 1 is coupled, $2 \times GM_f$ when 2 are coupled, $3 \times GM_f$ when 3 are coupled, and $4 \times GM_f$ when all of the transconductance blocks are coupled to capacitor 616.

Given a greater number of fixed transconductance blocks, more transconductance levels could be provided. Control circuit 618 controls the switches sequentially, respecting the required pass function of the filter, as will be described in more detail below.

Figure 6B:
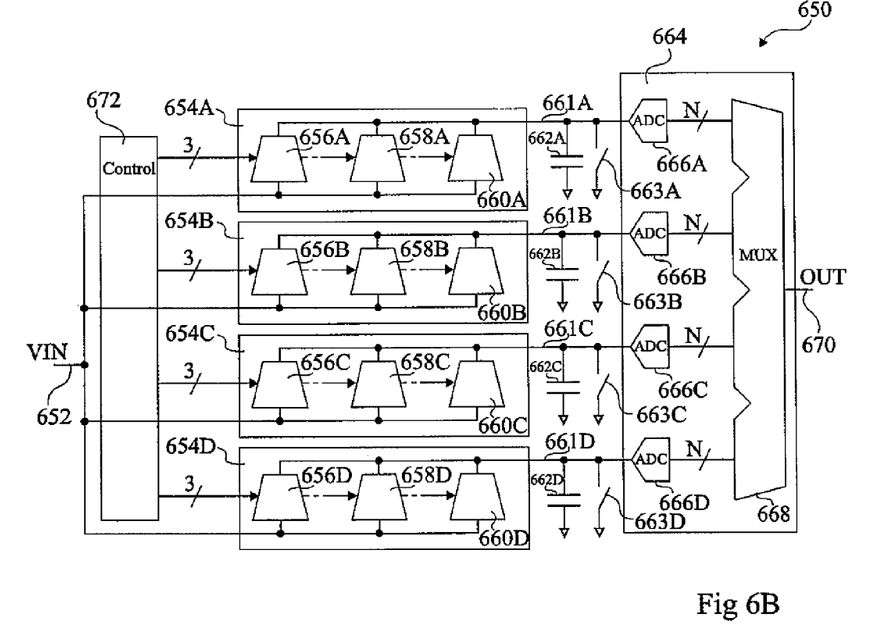
FIG. 6B illustrates an analog FIR filter according to an alternative embodiment of the present invention.

FIG. 6B illustrates an analog FIR filter 650 according to an alternative embodiment. An input line 652 is coupled to four variable transconductance blocks 654A to 654D arranged in parallel, each comprising three fixed transconductance blocks 656A to 656D, 658A to 658D and 660A to 660D respectively. The transconductance blocks 660A to 660D for example each have the same transconductance level as each other, which is for example equal to twice that of each of the transconductance blocks 658A to 658D, and for example four times that of each of the transconductance blocks 656A to 656D.

The outputs of transconductance blocks 656A to 660A are coupled to an output line 661A of block 654A, and similarly, the outputs of blocks 656B to 660B, 656C to 660C and 656D to 660D are coupled to respective output lines 661B to 661D of block 654B to 654D respectively. Each of the lines 661A to 661D is connected to a ground-coupled capacitor 662A to 662D respectively, to a ground-coupled switch 663A to 663D respectively, and to an ADC block 664.

The ADC block 664 comprises elementary ADCs 666A to 666D for converting the signals on the respective lines 661A to 661D into N-bit digital signals, which are provided to respective inputs of a digital multiplexer 668. The digital signals from ADCs 666A to 666D are selected in turn by the multiplexer 668 to provide the output signal of the FIR filter 650 on an output line 670.

A control block 672 outputs control signals to each of the variable transconductance blocks 654A to 654D, to control the transconductance levels of these blocks. In particular, each of the fixed transconductance blocks is activated or deactivated by a corresponding binary control signal to provide an output current. Thus in the example of FIG. 6B a 3-bit control signal is provided to each variable block 654A to 654D. Given that the fixed transconductance blocks of each variable block are chosen to have transconductance levels that vary by factors of 2, the 3-bit control signal allows one of a total of eight different transconductance levels of each block to be selected, corresponding to values of the 3-bit control signals of between "000" when none of the blocks are selected, and "111" when all the blocks are selected. While not shown in FIG. 6B, the control block for example also controls each of the switches 663A to 663D at the end of each cycle of each transconductance block 654A to 654D to reset the capacitor voltages.

Figure 7:
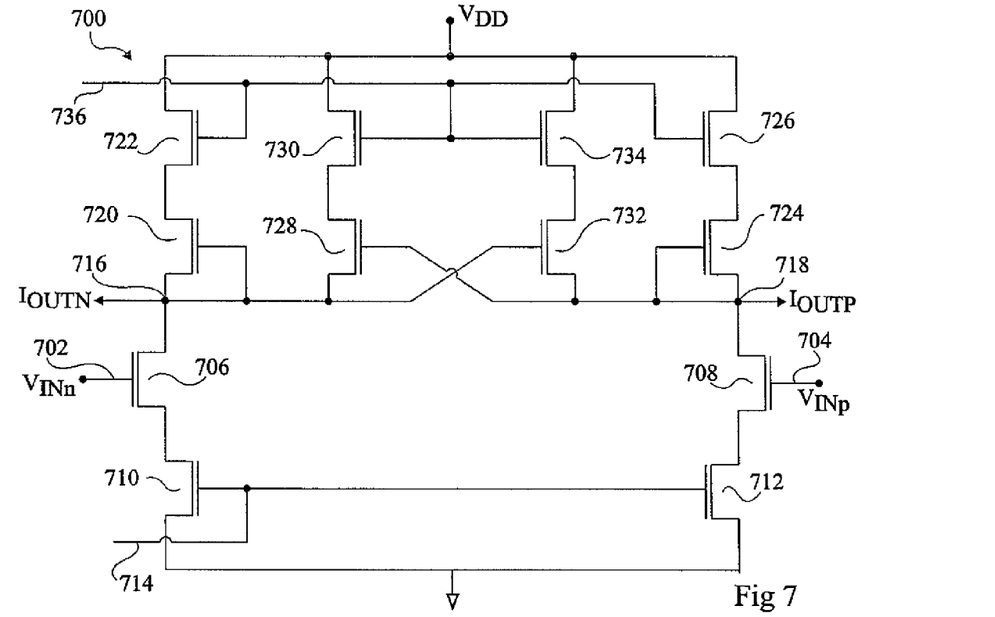
FIG. 7 illustrates a unitary transconductance block of the variable conductance block of FIG. 6A, FIG. 6B or the AFIR filter of FIG. 3 according to an embodiment of the present invention.

FIG. 7 illustrates a fixed transconductance block 700, which is for example one of the blocks 604 to 610 of FIG. 6A, one of blocks 656A to 660D of FIG. 6B, or one of the blocks 304 to 310 of FIG. 3, in more detail according to one embodiment.

The input voltage $V_{IN}$ of the block 700 is, for example, a differential voltage signal, comprising a first signal $V_{INn}$, and a second signal $V_{INp}$, these signals being coupled to input nodes 702 and 704 of the block 700. Nodes 702 and 704 are coupled to the gates of respective transistors 706 and 708, which are for example metal oxide semiconductor field effect transistors (MOSFETs). Transistors 706 and 708 form a (pseudo) differential pair, which convert the input voltage level into a current. One of the main current terminals of transistors 706 and 708 is coupled to nodes 716 and 718 respectively, which respectively provide the output currents $I_{OUTn}$ and $I_{OUTp}$. The other main current terminals of transistor 706 and 708 are coupled to a ground voltage, for example at 0 V, via transistors 710 and 712, which are controlled by a signal provided on line 714 to their gate nodes. Thus the signal on line 714 enables transistors 706 and 708 to be coupled to the ground voltage via transistors 710 and 712, or isolated from the ground voltage, thereby enabling or disabling the differential pair when required.

Node 716 is coupled to a supply voltage level $V_{DD}$ via transistors 720 and 722 coupled in series. Likewise, node 718 is coupled to the supply voltage $V_{DD}$ via a pair of transistors 724 and 726 coupled in series. Furthermore, node 716 is coupled to the supply voltage via a further pair of transistors 728 and 730 coupled in series, while node 718 is also coupled to the supply voltage via a further pair of transistors 732 and 734 coupled in series. The gate nodes of transistors 720 and 732 are coupled to node 716, while the gate nodes of transistors 728 and 724 are coupled to node 718, these transistors allowing the common mode voltage to be controlled. The gate nodes of transistors 722, 730, 734 and 726 are coupled to an input 736, which provides a control signal, allowing the differential pair 706 and 708 to be coupled to the supply voltage $V_{DD}$, or isolated from the supply voltage. The transistors 710, 712, 722, 730, 734 and 726 are switches that allow the fixed transconductance block 700 to be activated or deactivated.

Transistors 710 and 712 are for example NMOS transistors, while transistors 722, 730, 734 and 726 are for example PMOS transistors. Furthermore, the control signal on line 736 is for example the inverse of the control signal on line 714. Thus when the input signal on line 714 is high, the input signal line 736 is low, coupling the differential pair 706 and 708 to the supply voltage and the ground voltage, such that output currents $I_{OUTn}$ and $I_{OUTp}$ are provided at nodes 716 and 718.

On the other hand, to disconnect the differential pair from the outputs, a low voltage is provided on line 714, and a high voltage provided on line 736, thereby isolating the differential pair 706 and 708 from the ground voltage and from a supply voltage, and preventing an output current.

The transconductance level GM of block 700 is determined by the parameters of the transistors 706 and 708, which convert the input voltages $V_{INn}$ and $V_{INp}$ into current signal. For example, as will be apparent to those skilled in the art, width, length and input common mode voltage of the transistors can be varied to provide variable transconductance.

Operation of the analog FIR filters of FIGS. 3, 4, 5 and 6B will now be described in more detail with reference to FIGS. 8, 9A and 9B.

Figure 8:
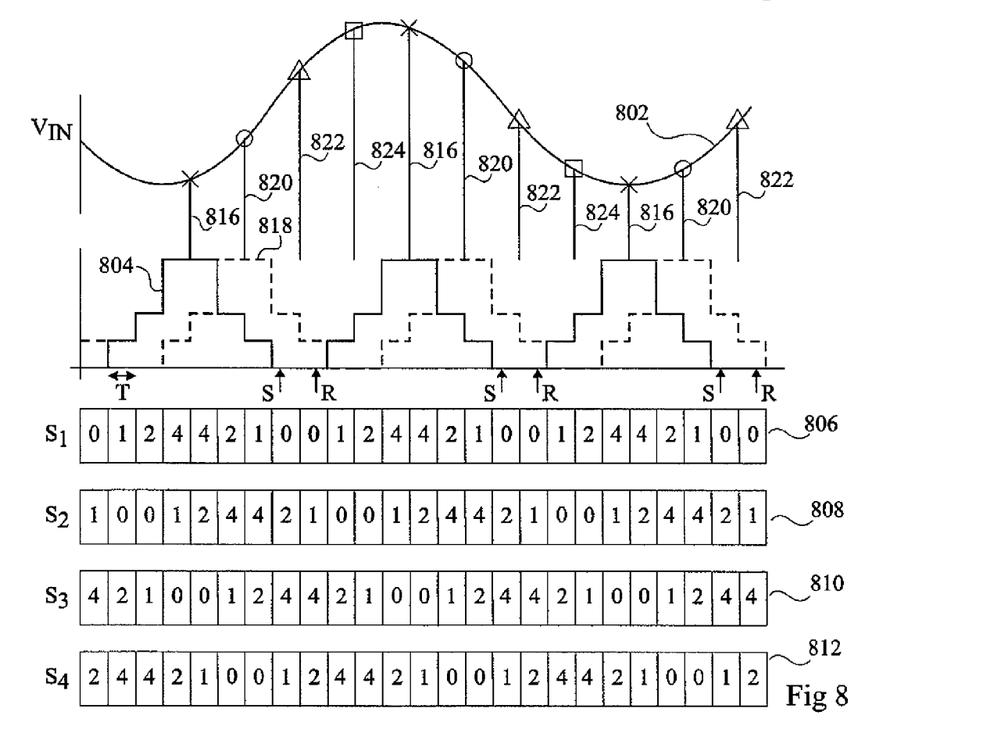
FIG. 8 illustrates an example of control signals applied to the variable transconductance block of FIG. 3, 4 or 5 for filtering an input signal according to an embodiment of the present invention.

The curve 802 at the top of FIG. 8 illustrates an example of the input voltage signal $V_{IN}$ to the analog FIR filter. A waveform 804 below the input voltage $V_{IN}$ represents the transconductance levels of a variable transconductance block, for example the blocks 304 to 310 of FIG. 3, the block 404 of FIG. 4, one of the blocks 504 to 510 of FIG. 5, or one of the blocks 654A to 654D of FIG. 6B. In this example, it is assumed that the transconductance block comprises four transconductance levels. As illustrated, a convolution function is provided with a pyramid-type form, which repeats every 8 T seconds.

A signal 806 represents the control signals provided by the control block 618 to control the blocks 604 to 610 to generate this convolution function. In particular, during a first period, none of the transconductance blocks is coupled via the switch block 612 to the output, as represented by a "0" in a first block of signal $S_1$, and in the following periods 1, 2, 4, 4, 2, 1, 0, 0, etc. transconductance blocks are coupled to the output node 614. In this way, the convolution function can be realized. For the signal $S_1$, the voltage on the capacitor of the corresponding transconductance block is periodically selected for sampling during the first of the two consecutive "0" periods, as indicated by the arrows labelled S in FIG. 8, and periodically reset during the second of the two consecutive "0" periods, as indicated by the arrows labelled R in FIG. 8. A similar sample and reset is for example performed during the "0" periods of the other signals $S_2$, $S_3$ and $S_4$.

Thus, the effect is to apply the convolution function to the input voltage signal at regular intervals for periods centred around points on the curve 802 indicated by reference numeral 816. Providing an output at only these intervals may be sufficient in some applications, and this filter operation for example corresponds to that of filters 300 and 400 of FIGS. 3 and 4.

On the other hand, when only a single variable transconductance block is used, an output is only provided every NT seconds, as explained above. Thus, in the present example, where there are a total of eight periods in each cycle with respective levels 0, 1, 2, 4, 4, 2, 1 and 0, a sample is only provided every 8 periods, in other words every 8 T seconds. If samples are to be provided at a higher rate, for example every MT seconds, then N/M variable transconductance blocks should be provided in parallel, where M is less than or equal to N, and where both N and M are natural numbers greater than zero. In the example of FIG. 8, it is assumed that a sample every 2 T seconds is desired, and thus four variable transconductance blocks are provided, for example the four blocks shown in FIG. 5, which are controlled by control signals $S_1$, $S_2$, $S_3$ and $S_4$.

The control signal $S_2$ is shown in FIG. 8 labelled 808, and follows the same sequence as control signals $S_1$, but delayed by two periods, resulting in the convolution function shown by the dashed line 818 in FIG. 8. This causes an output to be provided resulting from the application of the convolution function to the input signal, centred around points shown by reference numeral 820 in FIG. 8. Furthermore, the control signals S$_3$ and S$_4$ are shown labelled 810 and 812 in FIG. 8. Control signals S$_3$ are the same as the control signals S$_2$, but delayed by a further two periods, and the control signals S$_4$ are the same as the control signals S$_3$, but delayed by yet a further two periods. The result of these further control signals is to apply the convolution function to the input signal centred around points shown by arrows 822 and 824 in FIG. 8.

Figure 9A:
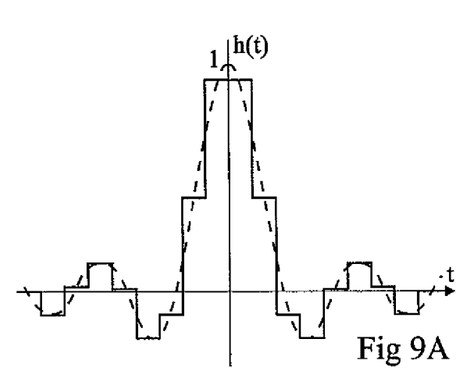
FIGS. 9A and 9B illustrate a convolution function and frequency response respectively of an analog FIR filter according to embodiments of the present invention.

Whereas in the example of FIG. 8 a simple convolution function is used, as represented by line 804, in alternative embodiments a more complex convolution function may be used, as shown in FIG. 9A. It should be noted that this convolution function is closer to an ideal sin c function when compared to the Dirac functions used as shown in FIG. 2A, and thus the filter has improved performance.

Figure 9B:
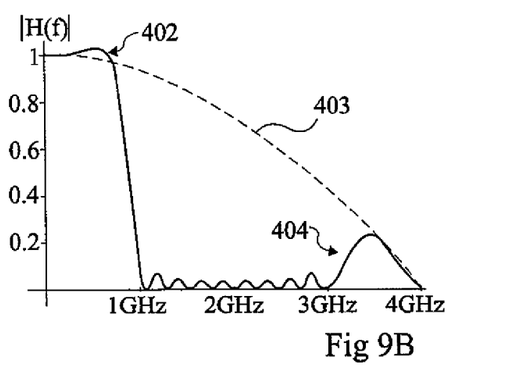

In particular, with reference to the frequency response graph shown in FIG. 9B, according to this example, a cut-off frequency of around 1 GHz can be provided, as shown by the line 402, but the output is also controlled by a sin c function resulting from the convolution with the pass function and shown by dashed line 403, which means that the frequency response, which rises again at 3 GHz in the case of FIG. 2B, only has a small increase shown by peak 404, and thus the high frequency repetition is removed.

In the example of FIG. 8, there are four distinct levels of transconductance (0, 1, 2, 4). In embodiments such as that of FIG. 6A, in which there are five distinct levels (0 to 4), or of FIG. 6B in which there are 8 distinct levels (0 to 7), the sequence can be chosen to more closely resemble the sin c function.

Figure 10:
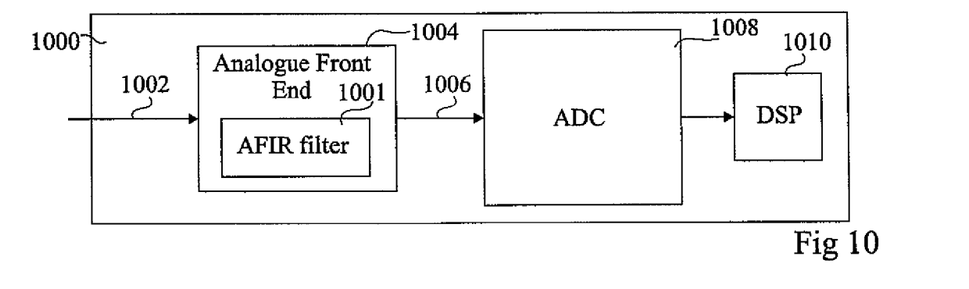
FIG. 10 illustrates an electronic device comprising an analog FIR filter according to embodiments of the present invention.

FIG. 10 illustrates an electronic device 1000 comprising an analog FIR filter 1001 according to embodiments of the present invention. Electronic device 1000 comprises an input node 1002, which receives, for example, a differential input voltage V$_{IN}$, which is provided to an analog front end 1004. The analog front end 1004 comprises for example an AC coupling to the node 1002, and the analog FIR filter 1001, which is, for example, the filter of any of FIGS. 3 to 5, 6A or 6B. The output of the analog front end 1004, and in particular from the analog FIR filter, is provided on line 1006 to an analog to digital converter 1008, which is in turn coupled to a digital signal processing block (DSP) 1010.

Electronic device 1000 is for example any device that receives an analog input signal to be filtered, before being digitalized by an analog to digital converter. Thus the electronic device 1000 could be any electronic device comprising an analog front end. For example, device 1000 could be a mobile telephone, set top box, personal computer, hard disk drive for a PC or laptop, MP3 player, radio receiver or other device.

Thus an AFIR filter has been described that convolutes a train of weighted pass functions (u(t+T/2)−u(t−T/2)). This means that little or no anti-aliasing filtering is needed, as repetitions of the target frequency are filtered out. Advantageously, as shown in FIGS. 6A and 6B, the output of the variable transconductance blocks can be connected directly to an ADC and digital multiplexer stage (620, 624, 664), without providing an anti-aliasing filter in between.

A further advantage is that the fixed transconductance blocks of each variable transconductance block are capable of being independently activated, allowing fast switching of the transconductance levels, and high flexibility with respect to the levels that may be selected by each transconductance block during each period.

A further advantage is that no track and hold circuit is used. In particular, rather than being based on a sample at a particular time instance of the input signal, the filtering is based on a weight applied to the input signal during a period of time.

A further advantage is that there is no parasitic pole at the summing node.

Having thus described at least one illustrative embodiment of the invention, various alterations, modifications and improvements will readily occur to those skilled in the art.

For example, while a few examples of convolution functions and cut-off frequencies of the filter have been provided, it will be apparent to those skilled in the art that in alternative embodiments the filter could have many different frequency responses.

Furthermore, it will be apparent that the number of transconductance levels applied by the filter will depend of the convolution function to be applied, and could range from just a couple of levels, to thousands of levels.

While particular examples of circuits for providing fixed and variable transconductance levels have been provided, other circuits are possible.

What is claimed is:

1. An analog finite impulse response (AFIR) filter comprising:
    at least one variable transconductance block comprising an input for receiving an input voltage and being adapted to sequentially apply each of a plurality of transconductance levels to said input voltage during at least one of a plurality of successive time periods to generate an output current at an output of said variable transconductance block, the at least one variable transconductance block comprising a plurality of fixed transconductance blocks each receiving said input voltage and capable of being independently activated to supply said output current; and
    a capacitor coupled to the output of the variable transconductance block to receive said output current and provide an output voltage of said filter.

2. The AFIR filter of claim 1, wherein each fixed transconductance block comprises a control input for receiving an activation signal.

3. The AFIR filter of claim 1, wherein the output of said at least one variable transconductance blocks is connected to an analog to digital converter.

4. The AFIR filter of claim 1, comprising a plurality of said variable transconductance blocks adapted to operate out of phase with each other, and a plurality of said capacitors each coupled to the output of a respective one of said variable transconductance blocks to receive the corresponding output currents.

5. The AFIR filter of claim 4, comprising a plurality of analog to digital converters coupled to said plurality of capacitors, and a digital multiplexer arranged to sequentially couple the outputs of said analog to digital converters to an output node to provide the output voltage of said filter.

6. The AFIR filter of claim 1, wherein each of said plurality of fixed transconductance blocks comprises at least one switch adapted to select or deselect the fixed level transconductance block to provide said output current, the AFIR filter comprising a control block adapted to control said at least one switch.

7. The AFIR filter of claim 6, wherein each of said plurality of fixed transconductance blocks has the same transconductance level, and wherein said control block is arranged to select a different number of said fixed level transconductance blocks to provide each of said plurality of transconductance levels.

8. The AFIR filter of claim 6, wherein said plurality of fixed transconductance blocks each comprises at least one transistor having a control terminal coupled to receive said input voltage, and main current terminals coupled to provide said output current to said capacitor when the fixed transconductance block is activated.

9. The AFIR filter of claim 1, wherein each of said plurality of fixed transconductance blocks has a fixed transconductance level equal to a respective one of said plurality of transconductance levels.

10. An electronic device comprising:
An input node for receiving an input voltage; and
the AFIR filter of claim 1 coupled to receive said input signal;
an analog to digital converter coupled to receive the output voltage of the filter; and
a digital signal processor coupled to the output of the analog to digital converter.

11. A hard disk drive comprising:
an input node for receiving an input voltage; and
the AFIR filter of claim 1 coupled to receive said input signal;
an analog to digital converter coupled to receive the output voltage of the filter; and
a digital signal processor coupled to the output of the analog to digital converter.

12. A mobile telephone comprising:
an input node for receiving an input voltage; and
the AFIR filter of claim 1 coupled to receive said input signal;
an analog to digital converter coupled to receive the output voltage of the filter; and
a digital signal processor coupled to the output of the analog to digital converter.

13. A radio receiver comprising:
an input node for receiving an input voltage; and
the AFIR filter of claim 1 coupled to receive said input signal;
an analog to digital converter coupled to receive the output voltage of the filter; and
a digital signal processor coupled to the output of the analog to digital converter.

14. The AFIR filter of claim 1, further comprising a switch coupled in parallel with said capacitor, the switch being arranged to periodically reset said capacitor.

15. A method of filtering an input signal comprising:
sequentially applying, by at least one variable transconductance block, each of a sequence of transconductance levels to said input signal during one or more of a plurality of successive time periods to generate an output current, the at least one variable transconductance block comprising a plurality of fixed transconductance blocks each receiving said input voltage and capable of being independently activated to supply said output current; and
receiving, by a capacitor, the output current to generate an output voltage of said filter.

16. The method of claim 15, wherein said step of applying said sequence of transconductance levels is repeated at first regular time intervals, the method further comprising performing said step of applying said sequence of transconductance levels at second regular time intervals offset with respect to said first regular time intervals.

17. The method of claim 16, further comprising periodically resetting the voltage on said capacitor.

18. The method of claim 15, wherein applying the sequence of transconductance levels comprises, for each transconductance level, selecting a number of said plurality of fixed transconductance blocks.

* * * * *

UNITED STATES PATENT AND TRADEMARK OFFICE
CERTIFICATE OF CORRECTION

| | |
|---|---|
| PATENT NO. | : 8,369,817 B2 |
| APPLICATION NO. | : 12/690793 |
| DATED | : February 5, 2013 |
| INVENTOR(S) | : Eoin Ohannaidh et al. |

It is certified that error appears in the above-identified patent and that said Letters Patent is hereby corrected as shown below:

Col. 4, line 16, should read:
response inverted every 1/T Hz, as illustrated by the second Col. 9, line 16, should read:
volution function is closer to an ideal sinc function when Col. 9, line 22, should read:
line 402, but the output is also controlled by a sinc function Col. 9, line 32, should read:
sequence can be chosen to more closely resemble the sinc Signed and Sealed this
Ninth Day of April, 2013

Teresa Stanek Rea
*Acting Director of the United States Patent and Trademark Office*